United States Patent
Heymann et al.

(10) Patent No.: US 8,432,764 B2
(45) Date of Patent: Apr. 30, 2013

(54) BOOST CELL SUPPLY WRITE ASSIST

(75) Inventors: Omer Heymann, Haifa (IL); Dana Bar-Niv, Lehavim (IL); Noam Jungmann, Haifa (IL); Elazar Kachir, Haifa (IL); Udi Nir, Tel Aviv (IL); Limor Plotkin, Tel Aviv (IL); Amira Rozenfeld, Hertzeliyya (IL); Robert C. Wong, Poughkeepsie, NY (US); Haining S. Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 404 days.

(21) Appl. No.: 12/778,223

(22) Filed: May 12, 2010

(65) Prior Publication Data

US 2011/0280094 A1    Nov. 17, 2011

(51) Int. Cl.
*G11C 5/14* (2006.01)

(52) U.S. Cl.
USPC .................... 365/226; 365/49.1; 365/203

(58) Field of Classification Search .................. 365/203, 365/205, 226, 227, 49.1
See application file for complete search history.

(56) References Cited

U.S. PATENT DOCUMENTS

2006/0262628 A1 * 11/2006 Nii et al. ...................... 365/226
2010/0002495 A1 * 1/2010 Adams et al. ................. 365/154

* cited by examiner

*Primary Examiner* — Richard Elms
*Assistant Examiner* — Hien Nguyen
(74) *Attorney, Agent, or Firm* — Zaretsky Patent Group PC; Suzanne Erez

(57) ABSTRACT

A method of increasing a drain to source voltage measured at an access pass-gate to a SRAM circuit in a SRAM memory array, including increasing a low voltage from a low voltage source powering said SRAM circuit, and increasing a high voltage from a high voltage source powering the SRAM circuit.

18 Claims, 4 Drawing Sheets

BOOST CELL SUPPLY WRITE ASSIST

FIELD OF THE INVENTION

The present invention relates to the field of static random access memory (SRAM) circuits, and more particularly relates to a method and mechanism for providing a boost cell supply write assist to a low power SRAM circuit.

BACKGROUND

A Static Random Access Memory (SRAM) cell (i.e., circuit) does not need to be periodically refreshed since it uses bi-stable latching circuitry to store each bit. Although a characteristic of an SRAM cell is data remembrance, data stored by the cell is volatile since the data is eventually lost when the cell is not powered.

Each bit in an SRAM cell is a circuit comprising four transistors that form two cross-coupled inverters. This storage cell has two stable states which are used to denote zero and one. Two additional access transistors serve to control the access to a storage cell during read and write operations. Access to the cell is enabled by a word line (WL) which controls the two access transistors which, in turn, control whether the cell should be coupled to bit lines $\overline{BL}$ and BL (i.e., each bit line coupled to a respective inverter). The bit lines are used to transfer data for both read and write operations.

During read operations, the bit lines are actively driven high and low by the inverters in the SRAM cell. The read operation starts by pre-charging both the bit lines to a logical one, then asserting the word line, enabling both access transistors. The values stored in the inverters are then transferred to the bit lines by leaving BL at its pre-charged value and discharging $\overline{BL}$ to a logical value of zero. On the BL side, the bit line is pulled toward Vdd (i.e., a logical value of one). If the content of the memory were a "0", the opposite would happen and $\overline{BL}$ would be pulled toward "1" and BL toward "0".

The start of a write cycle begins by applying the value to be written to the bit lines. If we wish to write a "0", we would apply a logical zero to the bit lines by setting $\overline{BL}$ to a logical one and BL to a logical zero (a one is written by inverting the values of the bit lines). The WL is then asserted and the value that is to be stored is latched in. In order to implement a write operation, the bit line input-drivers are designed to be much stronger than the (relatively) weak transistors in the cell itself, so that they can override the previous state of the cross-coupled inverters.

SUMMARY OF THE INVENTION

There is thus provided in accordance with an embodiment of the present invention, a method of increasing a drain to source voltage measured at an access pass-gate to a SRAM circuit in a SRAM memory array, including increasing a low voltage from a low voltage source powering said SRAM circuit, and increasing a high voltage from a high voltage source powering the SRAM circuit.

There is also provided in accordance with an embodiment of the present invention, a method of maintaining stability of a SRAM circuit including asserting a word line coupled to said SRAM circuit, charging two bit lines coupled to the SRAM circuit to a bit line voltage corresponding to a logical value of one, and decreasing the difference between the bit line voltage corresponding to a logical value of one and a low voltage in the SRAM circuit corresponding to a logical value of zero.

There is also further in accordance with an embodiment of the present invention, a method of writing to an SRAM circuit, including charging a first bit line coupled to the SRAM circuit to a first voltage corresponding to a logical value of one, charging a second bit line coupled to the SRAM circuit to a second voltage corresponding to a logical value of zero, increasing a low voltage from a low voltage source powering the SRAM circuit, increasing a high voltage from a high voltage source powering the SRAM circuit, and asserting a word line coupled to the SRAM circuit.

There is additionally provided in accordance with an embodiment of the present invention, a memory system, including a memory array comprising a plurality of SRAM circuits, each of the plurality of SRAM circuits coupled to a word line and a pair of bit lines, and a power management module operative to increase both a low voltage and a high voltage powering the plurality of SRAM circuits prior to a write operation to one or more of the plurality of SRAM circuits, thereby providing a write assist to said one or more SRAM circuits.

BRIEF DESCRIPTION OF THE DRAWINGS

The invention is herein described, by way of example only, with reference to the accompanying drawings, wherein.

DETAILED DESCRIPTION OF THE INVENTION

Notation Used Throughout

The following notation is used throughout this document:

| Term | Definition |
| --- | --- |
| BL | Bit Line |
| Gnd | Ground |
| Ids | Drain Source Current |
| Ipu | Pull-Up Current |
| L | Length |
| nFET | N Channel Field Effect Transistor |
| pMOS | P Channel Field Effect Transistor |
| SRAM | Static Random Access Memory |
| Vdd | Voltage Drain Drain |
| Vds | Drain to Source Voltage |
| Vds | Gate to Source Voltage |
| W | Width |
| WL | Word Line |

DETAILED DESCRIPTION OF THE INVENTION

Embodiments of the present invention provides a mechanism to implement a boost cell supply write assist for a static random access memory array (SRAM) by delivering elevated positive and ground supply voltages to the SRAM array during a write operation. During read operations, a standard positive and ground supply voltages are delivered to active regions (i.e., one or more subsets) of the SRAM array.

Embodiments of the present invention increase the positive and ground supply voltages by the same amount. This ensures the stability of memory circuits not being written to during the boost cell supply write assist, since the difference between the positive and ground supply voltages remains constant. Embodiments of the present invention can also be enhanced by increasing the voltage on the asserted word line during a write operation.

As technology scales smaller, there is a conflict between making an SRAM circuit faster to read and easier to write. SRAM circuits that are faster to read are harder to write and SRAM circuits that are easier to write are less stable and have an increased potential for the data to flip (i.e. change from a one to a zero or a zero to a one during a read operation).

Embodiments of the present invention are operative to aid in the design of reliable SRAM arrays. The present invention aids both in the writing of targeted SRAM circuits as well as the stability of non targeted SRAM circuits in the array. Additional benefits are that (1) embodiments of the present invention reside solely on the power path, thereby eliminating the need for special level shifters or other circuits on the SRAM array critical path and (2) performance impact is limited.

Figure 1:
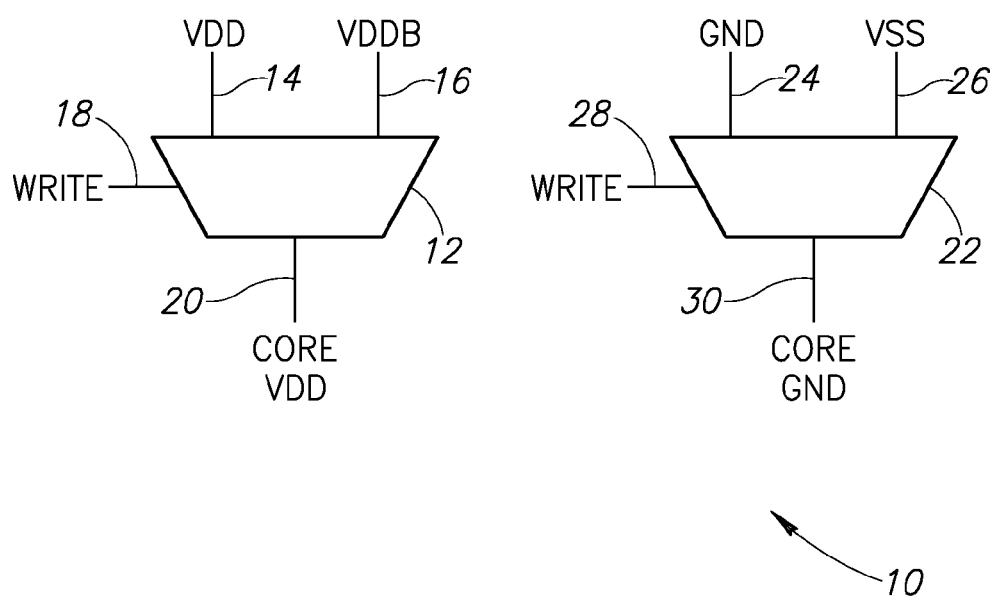
FIG. 1 is a circuit diagram illustrating an example implementation of an embodiment of the boost cell supply write assist method of the present invention.

In a first embodiment of the present invention, electronic devices are used to switch between the steady state of the memory array and the increased power levels used by the boost cell supply write assist method. While a power switching technique is described in this embodiment, any power generation technique can be implemented in order to supply the desired power levels. A schematic diagram of an example circuit implementing an embodiment of the present invention is shown in FIG. 1. The power management circuit, generally referenced 10, comprises multiplexers 12 and 22. Multiplexer 12 controls the positive supply voltage to a SRAM memory array and multiplexer 22 controls the ground supply voltage to the SRAM memory array. In an alternative embodiment, a charge pump comprising a capacitor can be used to increase voltages from high and low voltage sources powering the SRAM circuit. In embodiments of the present invention, the increase in the low voltage is in accordance with the high voltage, and the increases can be performed concurrently.

Inputs to multiplexer 12 comprise Vdd (the steady state positive supply voltage) 14, Vddb (increased positive supply voltage) 16 and write signal 18. The output of multiplexer 12 comprises Core Vdd 20, which is the positive supply voltage supplied to the SRAM array. Inputs to multiplexer 22 comprise Gnd (the steady state ground supply voltage) 24, Vss (increased positive supply voltage) 26 and write signal 28. The output of multiplexer 12 comprises Core Gnd 20, which is the ground supply voltage supplied to the SRAM array.

In operation, the steady state of the SRAM array has multiplexers 12 and 22 supplying Vdd positive supply voltage and Gnd ground supply voltage, respectively. Prior to a write operation, write signals 18 and 28 are activated, thereby instructing multiplexer 12 to switch to positive supply voltage Vddb and multiplexer 22 to switch to ground supply voltage Vss. Note that the difference between Vdd and Vddb is the same as the difference between Gnd and Vss (i.e. Vdd−Vddb=Vss).

Figure 2:
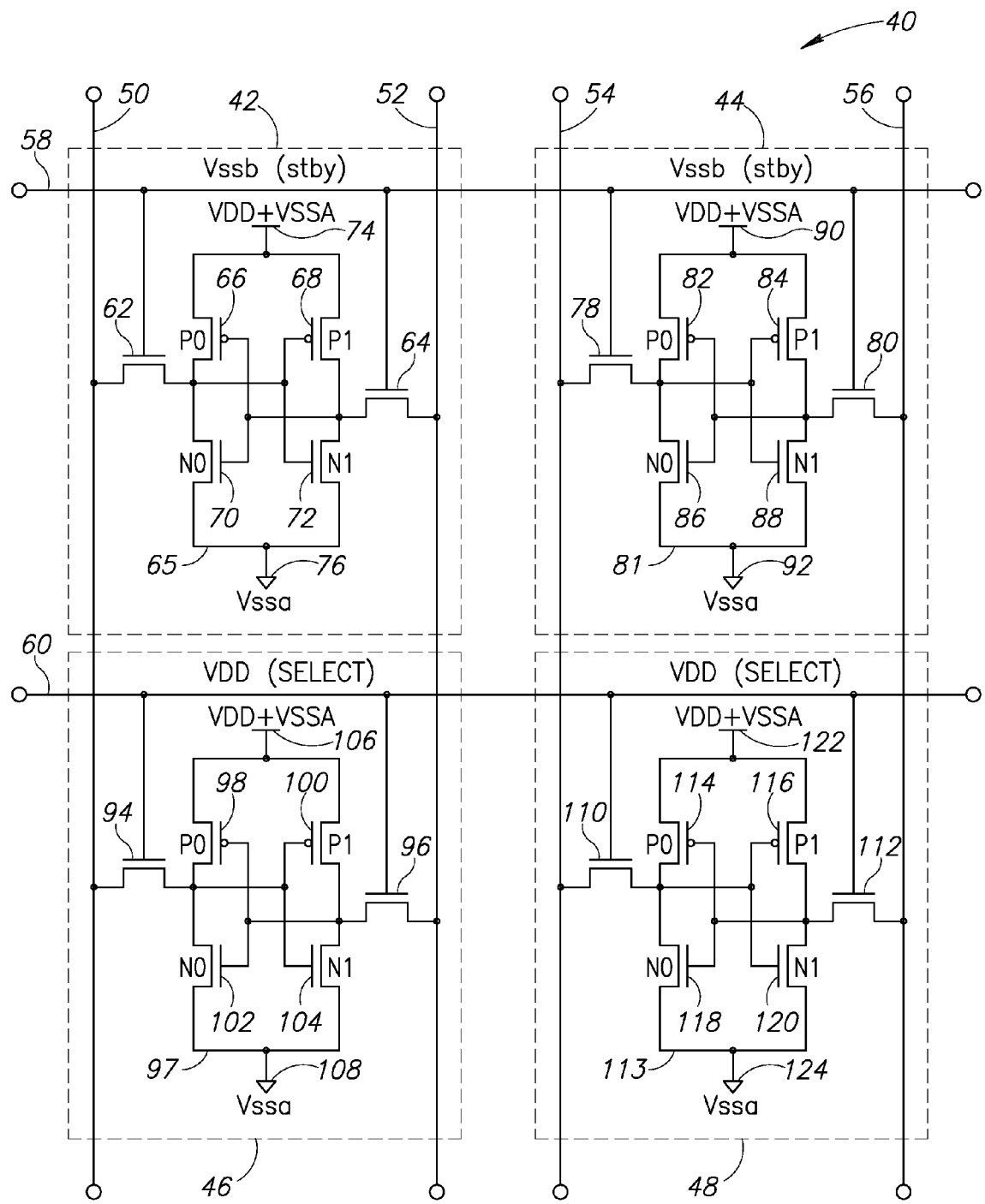
FIG. 2 is a circuit diagram illustrating a portion of a static random access memory array implementing an embodiment of the boost cell supply write assist method of the present invention.

A schematic diagram showing a portion of an SRAM array implementing an embodiment of the method of the present invention is shown in FIG. 2. The SRAM array, generally referenced 40 comprises SRAM circuits 42, 44, 46, 48, bit lines 50, 52, 54, 56 and word lines 58, 60. SRAM circuit 42 further comprises NFET pass gates 62, 64, back to back inverters 65 comprising PFETs 66, 68 and NFETs 70, 72, positive supply voltage input 74 and ground supply voltage input 76. SRAM circuit 44 further comprises NFET pass gates 78, 80, back to back inverters 81 comprising PFETs 82, 84 and NFETs 86, 88, positive supply voltage input 90 and ground supply voltage input 92. SRAM circuit 46 further comprises NFET pass gates 94, 96, back to back inverters 97 comprising PFETs 98, 100 and NFETs 102, 104, positive supply voltage input 106 and ground supply voltage input 108. SRAM circuit 48 further comprises NFET pass gates 110, 112, back to back inverters 113 comprising PFETs 114, 116 and NFETs 118, 120, positive supply voltage input 122 and ground supply voltage input 124.

In some embodiments of the present invention, prior to a write operation, the positive supply voltage of the SRAM circuit (typically a subset of the SRAM array) is increased from Vdd to Vdd+Vssa, and the ground supply voltage is increased from Gnd to Gnd+Vssa. In this (two by two cell) portion of the SRAM array, SRAM circuit 46 is selected to be written to by asserting (i.e. raising to Vdd) word line 60 and placing the appropriate voltages on bit lines 50 and 52 (i.e. either charging bit line 50 to Vdd and bit line 52 to Gnd or charging bit line 50 to Gnd and bit line 52 to Vdd, depending on the data being written). The bit lines are pre-charged at the beginning of each cycle (i.e., for a write operation one of the bit lines will be charged to a logical value of one and the other bit line will be charged to a logical value of zero). To perform a write operation, one of the bit lines is pulled to ground and a word line is activated (i.e. open), thereby opening the appropriate pass gate (note that all word lines are inactive, i.e. closed prior to the write operation). This enables the data to be written to the SRAM memory circuit (i.e. one side of the back to back inverter). The charge on the non asserted word line 58 is grounded or a standby value is applied (i.e. ground or another value with the provision that Vssb<Vssa).

In embodiments of the present invention, SRAM memory circuits not being written to (i.e. 42, 44 and 48 in FIG. 2) are stable, since they experience no difference in voltage potential between either the positive supply voltage and the ground supply voltage (since both are increased by the same amount) or the word lines and the bit lines. When its word line is active, SRAM circuit 48 experiences a stress, assuming its bit line stays at the pre-charged level. Since its internal power supply is boosted, SRAM circuit 48 sees less Vgs/Vds on its pass gate (on the side where the memory node is '0'). Therefore SRAM circuit 48 experiences less stress then it would with regular power settings in same conditions. Additionally, the other cells on the closed word line are "closed harder" since the Vgs of the pass-gate transistor on the zero side of the cell has a lower negative voltage (e.g., 0-Vssa).

When designing SRAM memory cells, device length (L) and width (W) have a direct influence on the cell stability. Referring to FIG. 2, consider an example where bit line 50 is charged to Vdd and bit line 52 is charged to Gnd. In this case, the pull-up ratio (also called the pull-up to pass-gate ratio) is $(W_{P100}/L_{P100})/(W_{N96}/L_{N96})$, where $W_{P100}$ is the width of pFET 100 (pulling down on bit line 52), $L_{P100}$ is the length of pFET 100, $W_{N96}$ is the width of nFET 96 (the pass gate) and $L_{N96}$ is the length of nFET 96. The cell ratio (also called the pull-down to pass-gate ratio or the transfer ratio) is $(W_{N102}/L_{N102})/(W_{N94}/L_{N94})$, where $W_{N102}$ is the width of nFET 102 (pulling up on bit line 50), $L_{N102}$ is the length of nFET 102, $W_{N94}$ is the width of nFET 96 (the pass gate) and $L_{N94}$ is the length of nFET 94.

The goal of having the pull-up to pass gate ratio such that the cell can be written (i.e. a strong pass gate), needs to be balanced with maintaining a relationship between the same pass gate and the nFET so that a read operation is not destructive. With technology shrinking and the supply voltage getting closer to the threshold voltage $V_t$ of the transistors, it is becoming more of a challenge to read and write SRAM circuits while maintaining performance goals. A "stronger" write is achieved by either lowering the pull-up ratio or increasing the Ids_pg to Ids_pu ratio. This can be achieved by having the BL voltage lower than the SRAM internal node voltage. Embodiments of the present invention change either node as long as the voltage difference is maintained. By elevating the cell GND the Ids_pg to Ids_pu ratio rises and assists the write operation.

By keeping all voltage potentials the same, embodiments of the present invention aid writing SRAM circuits while ensuring the stability of the SRAM circuits not currently accessed (i.e., either the word line is not asserted or both bit lines are charged to a logical value of one). Stability is improved due to the increase of the low voltage source in the SRAM cell, thereby resulting in a lower Vgs voltage on the pass-gate). Additionally, a wide range of write assist levels can be achieved, depending on the user implementation of the boost mechanism (i.e. the Vss delta).

The ability of an SRAM circuit to retain data most recently written to it while being read is referred to as "cell stability". The corruption of the SRAM circuit's contents while being read is known as a "read disturb". Devices in the SRAM circuit are sized in order to ensure that a minimum signal differential voltage is produced on the pre-charged bit lines in a fixed delay, while at the same time anticipating a wide variety of influences which can introduce bias into the SRAM circuit and diminish bit line differential voltage.

Cell stability during a read operation is determined by the ratios discussed supra. Depending on topology, the relative strengths of the pull down devices (e.g., nFETs 102 and 104 in FIG. 2) to their respective pass gates (e.g., nFETs 94 and 96 in FIG. 2) can vary due to their floating bodies, causing the cell ratio to assume a wider range of values. The cell ratio is a critical SRAM design parameter. If the pass gate becomes too strong with respect to the pull down nFET in series, the SRAM circuit being read may be overstressed by the bit line charge, and flip to a false data state. On the other hand, if the pass gate is too weak with respect to the pull-down, the SRAM circuit may not develop sufficient differential in the time allocated for the write operation.

Figure 3:
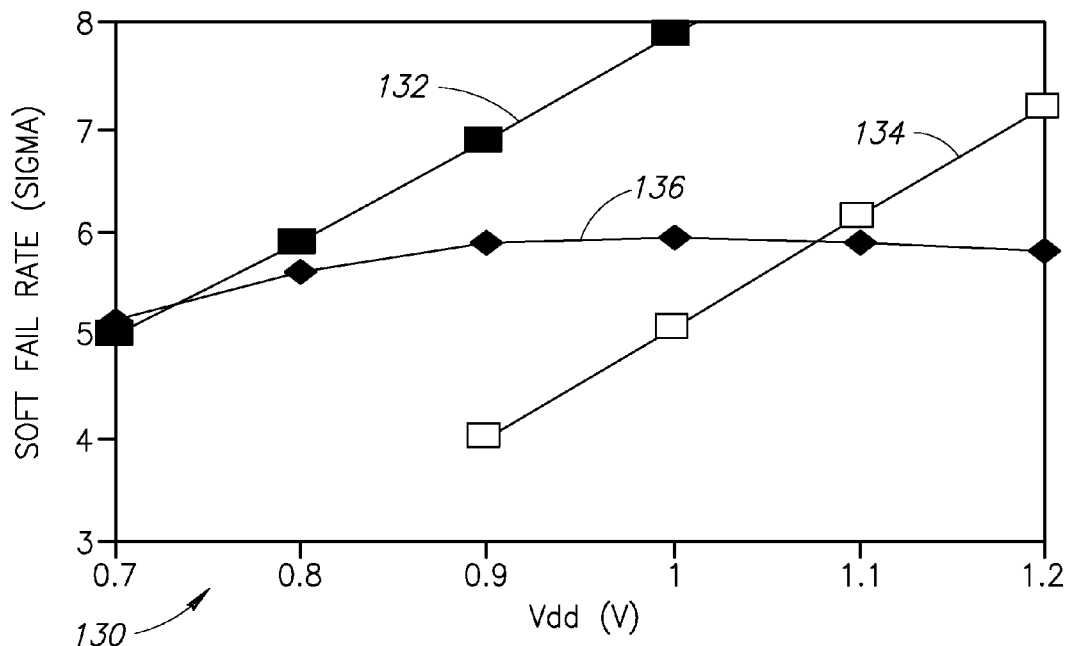
FIG. 3 is a chart illustrating the lower write fail rate experienced by a static random access memory array implementing an embodiment of the boost cell supply write assist method of the present invention.

A chart illustrating the failure rate of SRAM memory circuits as Vdd is increased using embodiments of the present invention is shown in FIG. 3. For a range of Vdd, the chart, generally referenced 130, plots write fail Sigma for write fails using the boost cell supply write assist method of the present invention 132, write fails without any assist 134 and read fails 136. At Vdd=0.9V, the chart shows a Sigma of (approximately) seven for writes implementing the boost cell supply write assist method of the present invention versus a Sigma of (approximately) four for writing with no write assist. In chart 130, the cell sigma rating describes the probability of a cell having the specific characteristics which will cause a failure. For example, a designer can expect 1 for a 5.3 Sigma cell failure for a 20 Mb SRAM.

Figure 4:
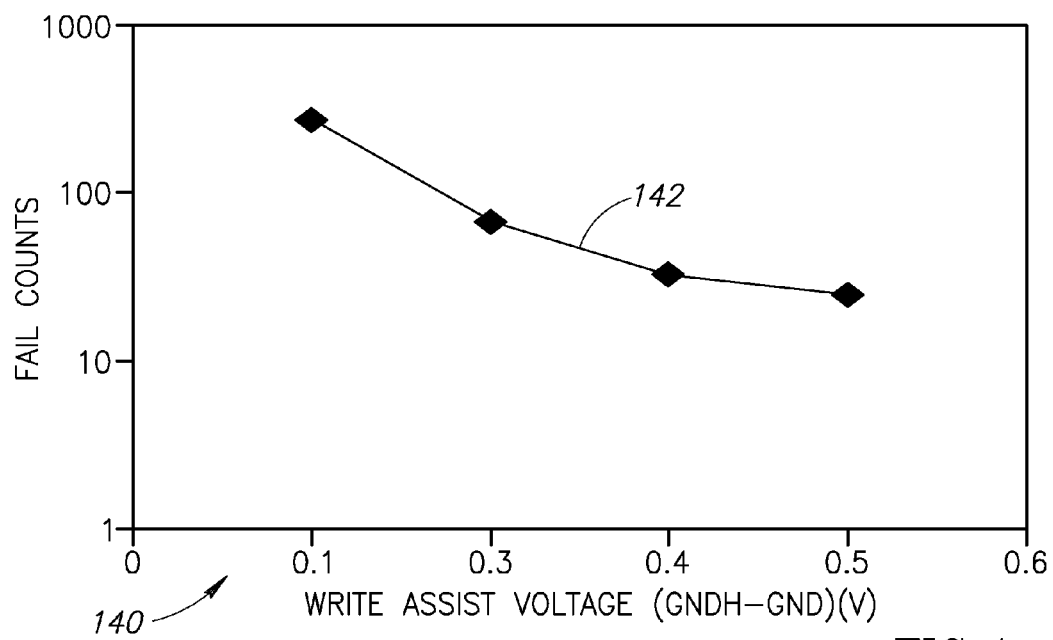
FIG. 4 is a chart illustrating measured fail counts as a function of write assist voltage in accordance with the boost cell supply write assist method of the present invention.

A chart illustrating measured fail counts as a function of write assist voltage in accordance with the boost cell supply write assist method of the present invention is shown in FIG. 4. Trace 142 shows measured fail counts as a function of the write-assist voltage. i.e. (Gnd+Vssa)-(Gnd).

Figure 5:
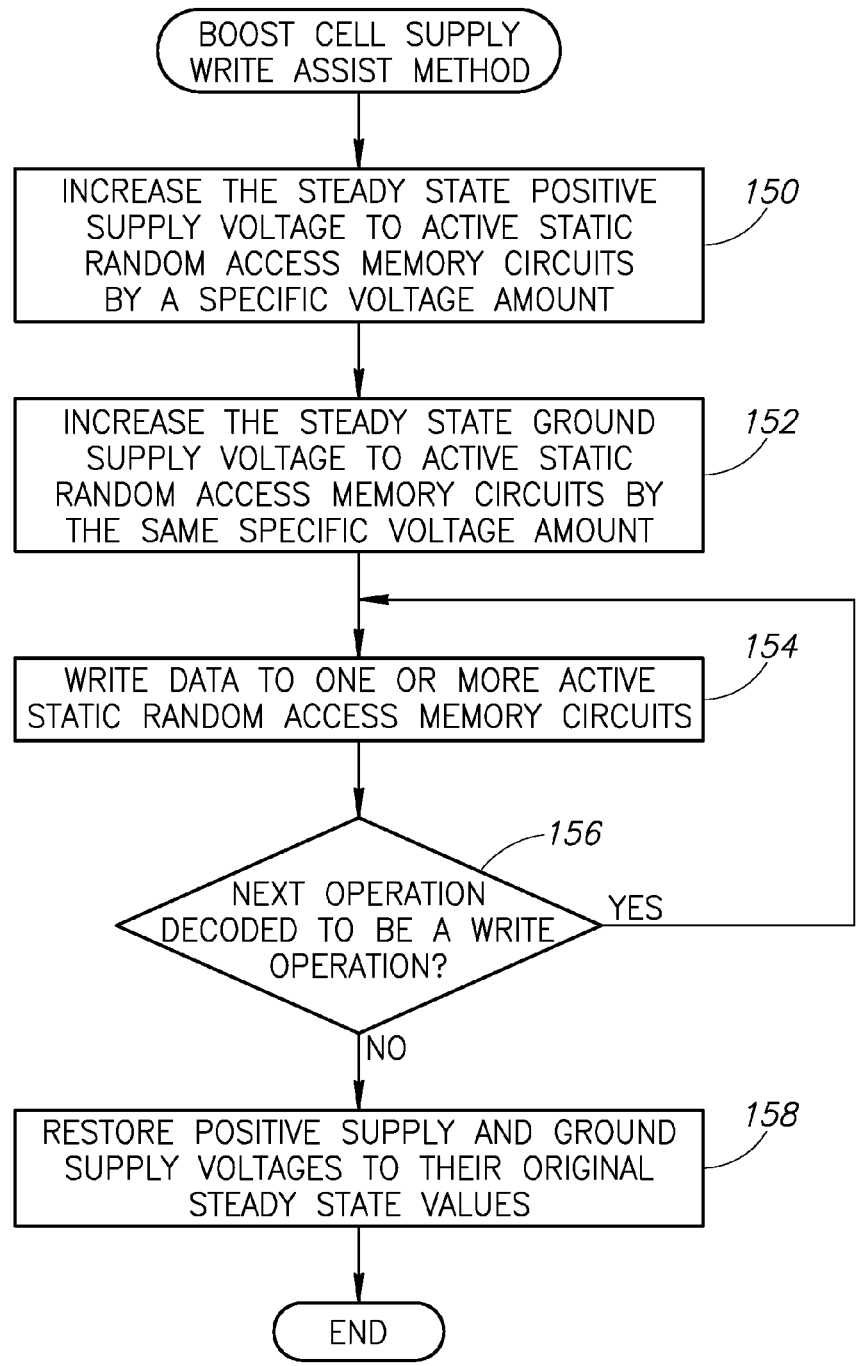
FIG. 5 is a flow diagram illustrating an embodiment of the boost cell supply write assist method of the present invention.

A flow diagram illustrating the boost cell supply write assist method of the present invention is shown in FIG. 5. Prior to a write operation, the positive supply voltage to the active section of the SRAM array is increased from its steady state by a specific voltage amount (step 150). The ground supply voltage to the SRAM array is then increased from its steady state by the same amount (step 152). Typically, the increased high and low (i.e., ground) voltages will be delivered to a subset of the SRAM array, where the SRAM cells to be written to are included in the subset.

Data is then written to one or more SRAM circuits in the active section of the SRAM array by asserting the word line(s) and charging bit lines to appropriate values (step 154). Finally, if the next operation is pre decoded to be a write (step 156), then the method returns to step 154. Otherwise, after current write operations to the active section of the SRAM array are completed, the positive and ground supply voltages are restored to their respective steady state values (step 156).

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

It is intended that the appended claims cover all such features and advantages of the invention that fall within the spirit and scope of the present invention. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention.

What is claimed is:

1. A method of increasing a drain to source voltage measured at an access pass-gate to a SRAM circuit in a SRAM memory array, comprising:
   increasing a ground voltage to said SRAM circuit from GND to VSSA prior to a write operation; and
   increasing a supply voltage to said SRAM circuit from VDD to VDD+VSSA prior to said write operation.

2. The method according to claim 1, wherein increasing the drain to source voltage provides a write assist to said SRAM circuit, when a write operation is performed to said SRAM circuit.

3. The method according to claim 1, wherein said increase of said supply voltage is in accordance to said increase of said GND voltage.

4. The method according to claim 1, wherein said step of increasing said GND voltage and said step of increasing said supply voltage are performed concurrently.

5. The method according to claim 1, wherein said steps of increasing said GND and supply voltages is performed by a voltage source switching mechanism operative to toggle between multiple voltage sources.

6. The method according to claim 1, wherein said steps of increasing said GND and supply voltages is performed by a charge pump, comprising a capacitor.

7. A method of maintaining stability of a SRAM circuit comprising:
   asserting a word line coupled to said SRAM circuit;
   charging two bit lines coupled to said SRAM circuit to a bit line voltage corresponding to a logical value of one; and
   decreasing a difference between said bit line voltage corresponding to a logical value of one and a low voltage in said SRAM circuit corresponding to a logical value of zero, wherein said step of decreasing the difference comprises:
   increasing a GND voltage to said SRAM circuit from GND to VSSA prior to
   a write operation; and
   increasing a supply voltage to said SRAM circuit from VDD to VDD+VSSA prior to said write operation.

8. The method according to claim 7, wherein said logical value of zero is stored by an inverter in said SRAM circuit.

9. The method according to claim 8, wherein said inverter storing the voltage corresponding to a logical value of zero is coupled to one of said bit lines charged to the bit line voltage corresponding to a logical value of one via an access pass-gate in said SRAM circuit.

10. The method according to claim 7, wherein said SRAM circuit is part of an SRAM array.

11. The method according to claim 10, wherein said steps of increasing the GND voltage and increasing the supply voltage are performed on a subset of SRAM circuits in said SRAM array, wherein said subset comprises one or more SRAM circuits to which a write operation will be performed.

12. The method according to claim 7, wherein said increase of said supply voltage is in accordance to said increase of said GND voltage.

13. The method according to claim 7, wherein said step of increasing said GND voltage and said step of increasing said supply voltage are performed concurrently.

14. A memory system, comprising:
   a memory array comprising a plurality of SRAM circuits, each of said plurality of SRAM circuits coupled to a word line and a pair of bit lines; and
   a power management module operative to increase by an amount VSSA both a GND voltage and a supply voltage powering said plurality of SRAM circuits prior to a write operation to one or more of said plurality of SRAM circuits, thereby providing a write assist to said one or more SRAM circuits.

15. The memory system according to claim 14, wherein said the increase of said GND voltage is in accordance with the increase of said supply voltage.

16. The memory system according to claim 14, wherein said increase of said GND and supply voltages are performed concurrently.

17. The power management module according to claim 14, wherein said increasing said GND and supply voltages is performed by a voltage source switching mechanism operative to toggle between multiple voltage sources.

18. The power management module according to claim 14, wherein said increasing said GND and supply voltages is performed by a charge pump, comprising a capacitor.

\* \* \* \* \*